United States Patent
Hayase et al.

(10) Patent No.: US 7,920,652 B2
(45) Date of Patent: Apr. 5, 2011

(54) ORTHOGONALITY DETECTOR, AND QUADRATURE DEMODULATOR AND SAMPLING QUADRATURE DEMODULATOR USING DETECTOR THEREOF

(75) Inventors: Shigenori Hayase, Tokyo (JP); Kazuyuki Hori, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 1054 days.

(21) Appl. No.: 11/005,073

(22) Filed: Dec. 7, 2004

(65) Prior Publication Data

US 2006/0056546 A1    Mar. 16, 2006

(30) Foreign Application Priority Data

Sep. 13, 2004   (JP) ................. 2004-264802

(51) Int. Cl.
*H04L 27/00* (2006.01)

(52) U.S. Cl. ........ 375/324; 375/130; 375/260; 375/316; 375/343; 455/209; 455/214; 455/324; 455/334

(58) Field of Classification Search ................ 375/269, 375/272–273, 279–280, 303, 308, 316, 323–324, 375/329–331, 340, 343, 362, 371–373, 375, 375/293, 295, 259, 260, 267, 299; 455/209, 455/214

See application file for complete search history.

(56) References Cited

U.S. PATENT DOCUMENTS

| | | | |
|---|---|---|---|
| 6,781,448 B2 | 8/2004 | Kawai | ............................. 329/304 |
| 6,853,692 B2 | 2/2005 | Myers | |
| 7,209,526 B2 * | 4/2007 | Kim et al. | ...................... 375/316 |
| 7,280,623 B2 * | 10/2007 | Gupta et al. | ................... 375/343 |
| 7,305,211 B2 * | 12/2007 | Dent | ............................ 455/12.1 |
| 7,433,431 B2 * | 10/2008 | Birkett | ........................... 375/345 |
| 2003/0012305 A1 * | 1/2003 | Auranen | ........................ 375/316 |
| 2003/0143966 A1 * | 7/2003 | Kim et al. | ...................... 455/209 |
| 2004/0247133 A1 * | 12/2004 | Gierl et al. | ......................... 381/7 |
| 2005/0047384 A1 * | 3/2005 | Wax et al. | ..................... 370/338 |
| 2005/0069059 A1 * | 3/2005 | Krivokapic | ................... 375/340 |

FOREIGN PATENT DOCUMENTS

| | | |
|---|---|---|
| JP | 02-075966 | 3/1990 |
| JP | 04-250149 | 9/1992 |
| JP | 2002-247124 | 8/2002 |
| JP | 2003-258931 | 9/2003 |
| JP | 2003-318759 | 11/2003 |

OTHER PUBLICATIONS

B. Razavi, "Design Considerations for Direct-Conversion Receivers," IEEE Transactions on Circuits and Systems—II: Analog and Digital Signal Processing, vol. 44, No. 6, Jun. 1997, pp. 428-435.

* cited by examiner

*Primary Examiner* — Shuwang Liu
*Assistant Examiner* — Hirdepal Singh
(74) *Attorney, Agent, or Firm* — Miles & Stockbridge P.C.

(57) ABSTRACT

To detect phase mismatches between in-phase and quadrature signals of a quadrature demodulator. The phase mismatches can be detected using the signals obtained by removing high frequency components of output of a multiplier by a low pass filter, the output being the product of the in-phase signals of which low frequency components are removed by a first high pass filter by the quadrature signals of which low frequency components are removed by a second high pass filter.

6 Claims, 13 Drawing Sheets

CONVERSION GAIN MISMATCHING CASE

ORTHOGONALITY DETECTOR, AND QUADRATURE DEMODULATOR AND SAMPLING QUADRATURE DEMODULATOR USING DETECTOR THEREOF

CLAIM OF PRIORITY

The present application claims priority from Japanese application JP 2004-264802 filed on Sep. 13, 2004, the content of which is hereby into this application.

FIELD OF THE INVENTION

This invention relates to a quadrature demodulator in digital communication, in particular to a quadrature demodulator performing phase mismatch compensation using an orthogonality detector and a sampling quadrature demodulator performing group delay difference compensation.

BACKGROUND OF THE INVENTION

In the past, as a method for compensating conversion gain error, a feedback loop was used as a structure for calculating difference of the amplitudes of in-phase signals and quadrature signals and amplifying the amplitude of the in-phase or quadrature signals so as to make the calculation result to be zero (for example, Patent document 1). Also in the past, as receiver architecture, sub-sampling in an A/D (analogue/digital) converter was used (for example, Patent document 2). Furthermore, in the past, as a method for compensating phase mismatch, orthogonality was detected by calculating the product of in-phase signals (I) by quadrature signals (Q) and finding out their cross correlation (for example, Non-patent document 1).

[Patent document 1] Japanese Unexamined Patent Application Publication No. 2003-258931

[Patent document 2] Japanese Unexamined Patent Application Publication No. 2003-318759

[Non-patent document] Behzad Razavi, 'design Considerations for Direct-Conversion Receivers', IEEE Transaction on Circuits and Systems II, vol. 44, no. 6, pp. 428-435, 1997

SUMMARY OF THE INVENTION

FIG. 11 shows a block diagram of a receiver structure in direct conversion manner. From the signals received by an antenna 251, frequency components other than frequency bands to be received are filtered out by a band pass filter 261 for band selection, and the signals are input into an LNA (low noise amplifier) 271 for improving noise figure of the entire receiver. The signals of outputs of the LNA 271 other than desired frequency bands are removed by a band pass filter 263 for channel selection, and the outputs are amplified by an AGC (Automatic Gain Control) amplifier 281. The outputs of the AGC amplifier 281 are converted into in-phase signals and quadrature signals at a quadrature demodulation section consisting of a local oscillator 151, a fixed phase shifter 171, mixers 142, 143, and low pass filters 132, 133. The frequency components of outputs of the mixers 142, 143 other than desired bands are removed by low pass filters 132, 133 for channel selection. The outputs of the low pass filters 132, 133 are synchronized with the outputs of the local oscillator 151 and converted into digital signals by A/D (analogue/digital) converters 201, 202. Then the outputs of the A/D converters 201, 202 are processed by a digital signal processor.

On the other hand, as receiver architecture, there used to be a manner different from the direct conversion manner as shown in Patent document 2. In this manner, sub-sampling in an A/D (analogue/digital) converter is used for quadrature demodulation. Hereinafter, this receiver architecture is called sampling quadrature demodulation manner.

FIG. 12 shows a block diagram illustrating the sampling quadrature demodulation manner. From the signals received by the antenna 251, frequency components other than frequency bands to be received are filtered out by the band pass filter 261 for band selection, and the signals are input into the LNA 271 for improving noise figure of the entire receiver. The frequency components of the outputs of the LNA 271 other than predetermined bands are removed by a band pass filter 262, and the carrier frequency of the outputs is converted by inputting the outputs into the mixer 141 together with the outputs of the local oscillator 152. The signals of outputs of the mixer 141 other than desired frequency bands are removed by the band pass filter 263 for channel selection, and the outputs are amplified by the AGC amplifier 281. The outputs of the AGC amplifier 281 are converted into in-phase digital signals and quadrature digital signals at a quadrature demodulation section consisting of the local oscillator 151, the fixed phase shifter 171, and A/D converters 201, 202. Since the outputs of the A/D converters 201, 202 are shifted by ¼ sample in sampling timing, the timing is synchronized by a latch 211 for enabling afterward digital processing. Then the outputs of the latch 211 are processed by the digital signal processor.

In quadrature demodulation in direct conversion manner or sampling quadrature demodulation manner, theoretically, conversion gains from RF signals into in-phase signals and quadrature signals are identical and the phase would be orthogonal. However, due to dispersion in performance of a device, there would be errors in the conversion gains or orthogonality. Because of such errors, there was a problem of increase in the bit error rate at the time of receiving.

Taking receiving of QPSK modulation signals as example, this problem is described. FIG. 13A shows constellation of received signals when there are errors in the conversion gain. In a theoretical reception, symbols are arranged on a circle, however when there are errors in the conversion gain, the symbols are arranged on an ellipse and in this case, there are errors in the amplitude between in-phase signals and quadrature signals. FIG. 13B shows constellation of received signals when there are phase mismatch. Since the symbols are arranged on an ellipse as well when there are phase mismatch, in this case, there are errors in the amplitude between in-phase signals and quadrature signals. There was a problem that such errors increase the bit error rate.

Patent document 1 discloses a method for compensating the conversion gain errors. In this method, a feedback loop is used as a structure for calculating difference of the amplitudes of in-phase signals and quadrature signals and amplifying the amplitude of the in-phase or quadrature signals so as to make the calculation result to be zero. Non-patent document 1 discloses a method for compensating the phase mismatch. In this manner, the orthogonality is detected by calculating the product of in-phase signals (I) by quadrature signals (Q) using a circuit as shown in FIG. 9 and finding out their cross correlation=E[I·Q] (where, E[ ] indicates the average]. In FIG. 9, an orthogonality detector 101, a multiplier 121 and a low pass filter 131 are shown. Compensation is performed by structuring a feedback for controlling a phase shifter of a quadrature demodulator so as to make the cross correlation to be zero.

The conventional manner as shown in Non-patent document 1 had the problem of long convergence time at detecting orthogonality of phases between in-phase and quadrature signals. This is because base band signals include direct current components and low frequency components. Since detecting phase takes time in inverse proportion to the frequency, it would have an essential problem.

Sub-sampling quadrature demodulation manner includes latch operation, which is particular in this manner. Because of the latch, group delay difference is created between in-phase signals and orthogonal signals (ideally ¼ sample time). This difference might cause increase in the bit error rate. However, so far, compensation of such group delay difference has not been considered. Also since the orthogonality between in-phase signals and quadrature signals is achieved by shifting the sampling timing, phase mismatch and sampling timing errors would occur coincidently. Accordingly, variable group delay difference compensation has been required according to the phase mismatch.

To solve the above mentioned problems, according to the present invention, the convergence time is reduced by detecting the orthogonality of phase between in-phase and quadrature signals using the covariance of the in-phase and quadrature signals. To be more concrete, a typical example according to the present invention is described below. An orthogonality detector according to the present invention comprises a first high pass filter for removing low frequency components of a first input signal, a second high pass filter for removing low frequency components of a second input signal, a multiplier for multiplying the respective outputs of the first and second high pass filters each other, and a low pass filter for removing high frequency components from the output of the multiplier, wherein the orthogonality between the first and second signals is detected based on the outputs of the low pass filter.

According to the present invention, since the product is calculated after removing low frequency components, the orthogonality can be detected quickly.

DETAILED DESCRIPTION OF THE PREFERRED EMBODIMENTS

Figure 1:
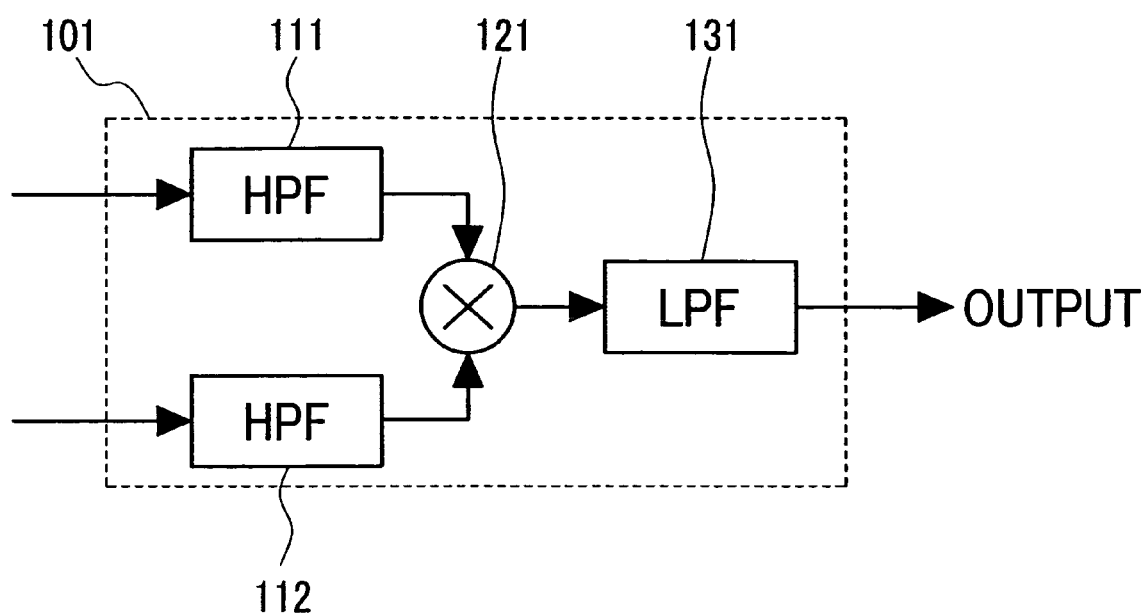
FIG. 1 shows a block diagram of an orthogonality detector of a first embodiment according to the present invention.

An orthogonality detector according to the present invention is structured so as to calculate covariance of two input signals and to detect orthogonality between the two signals from the calculated covariance. The covariance can be obtained by inputting the two signals respectively into a high pass filter to remove low frequency components from the two signals and by multiplying the respective outputs of the high pass filter each other by a multiplier. To be more specific, the covariance can be obtained by further inputting the outputs of the multiplier into the low pass filter and by removing high frequency components from the outputs of the multiplier.

The orthogonality detector according to the present invention detects phase mismatches or amplitude errors between the detected orthogonality by the detector itself. In the orthogonality detector for detecting orthogonality of in-phase and quadrature signals, the covariance between the in-phase signals and quadrature signals is calculated by removing low frequency components of the in-phase signals using a first high pass filter, removing low frequency components of the quadrature signals using a second high pass filter, multiplying the outputs of the first and second high pass filters using a multiplier, and removing high frequency components of the output of the multiplier using a low pass filter.

For group delay difference (ideally, ¼ sampling time) in sub-sampling quadrature demodulation manner, the in-phase and quadrature signals are compensated by delaying the signals by a delay device or a digital filter having group delay functions and by providing delay difference to the in-phase signals and quadrature signals. The group delay difference depending on phase mismatches is compensated by delaying either or both of the in-phase and quadrature signals by a variable delay device. The delay quantity to be compensated is determined according to the output of the orthogonality detector based on the covariance. The multiplication by the multiplier is statistically equivalent to calculation of the covariance between a variable I and a variable Q.

$$\text{Covariance} = E[(I-E[I])(Q-E[Q])]$$

It is well known that when I and Q are uncorrelated, the covariance would be zero. Also, when I and Q have close correlation, the covariance would be larger. Applicants found out the property of the covariance that based on the above mentioned principle, where the in-phase components (I-components) of the signals are variables I and the quadrature components (Q-components) of the signals are variables Q, the state of the in-phase components and quadrature components being completely orthogonal is considered to be uncorrelated and the covariance would be zero while the covariance would be larger as the orthogonality is lower. They further found out that the covariance can be also used as an index for the orthogonality similarly as cross correlation and finally, they have proposed a concrete circuit structure for detecting the orthogonality using above mentioned property as an orthogonality detector according to the present invention.

In detecting the orthogonality of in-phase and quadrature signals, the low frequency components also contributed to phase detection since the detection was performed based on a simple cross correlation and accordingly, it took long time for phase detection. However, with respective embodiments according to the present invention as described below, since the product is calculated after removing the low frequency components, the orthogonality can be detected quicker.

First Embodiment

Figure 9:
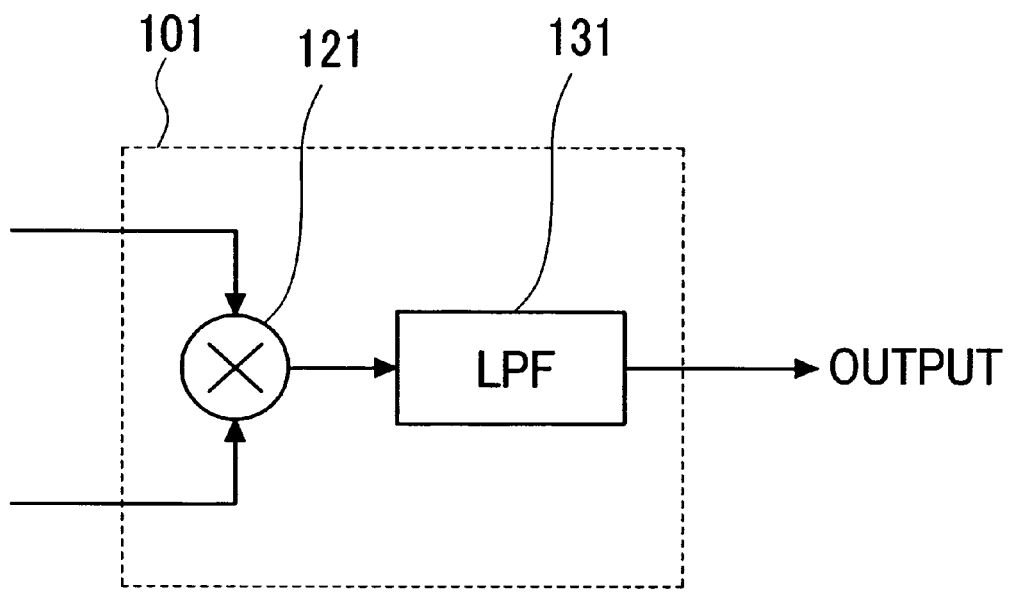
FIG. 9 shows a block diagram illustrating a conventional orthogonality detector.

FIG. 1 shows a block diagram of an orthogonality detector of a first embodiment according to the present invention. The orthogonality detector 101, high pass filters 111, 112, a multiplier 121 and a low pass filter 131 are provided. This orthogonality detector is different from a conventional orthogonality detector based on the cross correlation as shown in FIG. 9 in the point of the high pass filters 111, 112 being arranged thereon.

An orthogonality detector 101 comprises a first high pass filter 111 for removing low frequency components of a first input signal, a second high pass filter 112 for removing low frequency components of a second input signal, a multiplier 121 for multiplying the respective outputs of the first and second high pass filters 101, 102 each other, and a low pass filter 131 for removing high frequency components from the output of the multiplier 121. The orthogonality between the first and second signals is detected based on the outputs of the low pass filter 131.

Low frequency components of the two signals input into the orthogonality detector 101 are removed by the high pass filter, and the signals are multiplied by the multiplier 121. Thus, the covariance can be obtained. High frequency components of the covariance obtained from the outputs of the multiplier 121 are removed by the low pass filter 131. The outputs of the multiplier 121 include high frequency components not required as index of the orthogonality and occurred by signal modulation in addition to the covariance. For removing the high frequency components, the low pass filter 131 is required.

Thus, the phase mismatches or amplitude errors between the first and second signals are detected from the orthogonality between the first and second signals detected in such a manner. According to the present embodiment, orthogonality can be detected quickly compared to a conventional case based on the cross correlation by using the outputs of the low pass filter 131 as index of the orthogonality.

Second Embodiment

Figure 2:
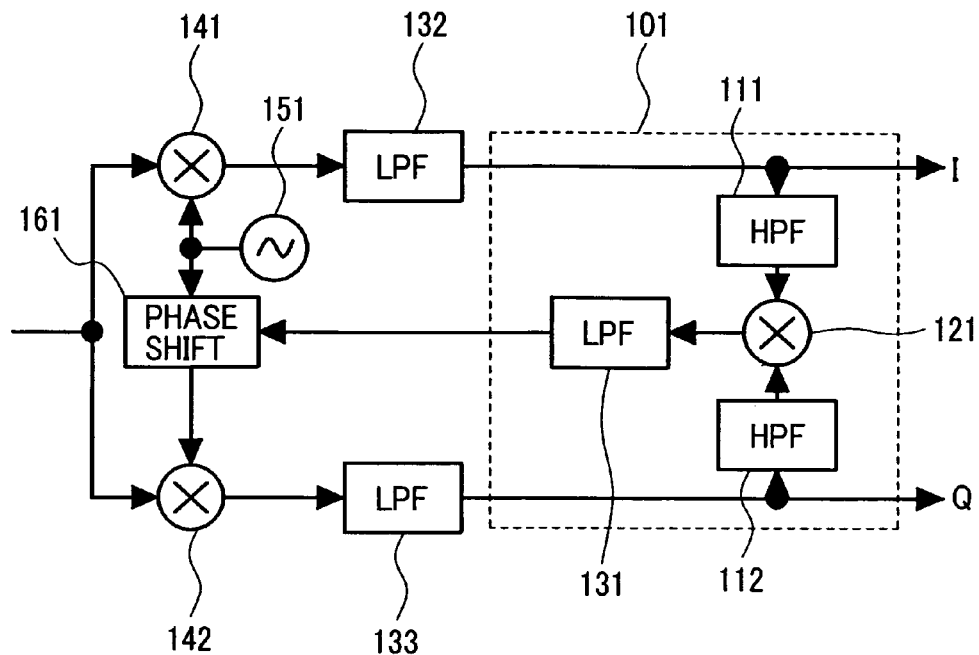
FIG. 2 shows a block diagram of an example of a quadrature demodulator having functions for compensating orthogonality using the orthogonality detector according to the present invention as a second embodiment of the present invention.

FIG. 2, illustrating a second embodiment according to the present invention, shows a block diagram of a quadrature demodulator having an phase mismatch compensation circuit for compensating errors between in-phase and quadrature signals using the orthogonality detector according to the present invention. Components 101, 111, 112, 121, 131 constitute an orthogonality detector as similarly as in the first embodiment. Low pass filters 132, 133, mixers 141, 142, a local oscillator 151 and a variable phase shifter 161 constitute a quadrature demodulation circuit section. A quadrature demodulator in the present embodiment comprises the quadrature demodulation circuit section and the orthogonality detector into which the outputs of the quadrature demodulation circuit section is input. It further comprises a circuit for compensating phase mismatches between in-phase and quadrature components of the outputs of the quadrature demodulation circuit section based on the outputs of the orthogonality detector 101.

The orthogonality detector 101 comprises a first high pass filter 111 for removing low frequency components of in-phase components of the signals input from quadrature demodulation circuit section, a second high pass filter 112 for removing low frequency components of quadrature components of the signals input from the quadrature demodulation circuit section, a multiplier 121 for multiplying the respective outputs of the first and second high pass filters 111, 112 each other, and a low pass filter 131 for removing high frequency components from the outputs of the multiplier 121, wherein the orthogonality between the in-phase and quadrature components of the signals input from the quadrature demodulation circuit section is detected based on the outputs of the low pass filter 131. The outputs of the quadrature demodulation circuit section of which phase mismatches are compensated based on the orthogonality of the two signals detected in such a manner are considered to be the outputs of the quadrature demodulator.

The quadrature demodulation circuit section comprises the local oscillator 151, the first mixer 141 outputting in-phase components of the input signal of the quadrature demodulation circuit section, the second mixer 142 outputting quadrature components of the input signals of the quadrature demodulation circuit section, and the variable phase shifter 161 connected between the output terminal of the orthogonality detector 101 and the input terminal of either the first or second mixer 141, 142. The variable phase shifter 161 changes phase shift quantity of the variable phase shifter 161 based on the outputs of the orthogonality detector 101 and controls input phase of any of the first or second mixer 141, 142 to which the output terminal of the variable phase shifter 161 is connected.

The input terminal of the variable phase shifter 161 of this embodiment is connected to the output terminal of the local oscillator 151 commonly with any of the first or second mixer 141, 142, the output terminal of the variable phase shifter 161 is connected to the other one of the mixers 141, 142, and the outputs of the local oscillator 151 of which phase is controlled by the variable phase shifter 161 is supplied to which of the first or second mixer 141, 142 the output terminal of the variable phase shifter 161 is connected. FIG. 2 shows an example of structure of which the output terminal of the local oscillator 151 is connected to the input terminal of the first mixer 141, and the output terminal of a variable phase comparator 161 is connected to the input terminal of the mixer 142. This embodiment is not limited only to this structure. It also includes, for example a structure of which the output terminal of the local oscillator 151 and the output terminal of the variable comparator 161 are exchanged each other, that is, the output terminal of the variable comparator 161 is connected to the input terminal of the first mixer 141, and the output terminal of the local oscillator 151 is connected to the input terminal of the second mixer 142.

The orthogonality between the in-phase and quadrature signals demodulated by quadrature demodulator and output from the low pass filters is detected by the orthogonality detector according to the present invention. Orthogonality between the in-phase and quadrature signals is compensated by controlling phase shift quantity of the variable phase shifter 161 using the detected signals and adjusting the phase of oscillation signals input into the mixer 142. According to the present embodiment, orthogonality can be detected quickly compared to a conventional case based on the cross correlation by using the outputs of the low pass filter 131 as index of the orthogonality, and accordingly, a quadrature demodulator capable of quickly outputting signals consisting of the in-phase and quadrature components compensated in the phase mismatches can be realized.

Third Embodiment

Figure 3:
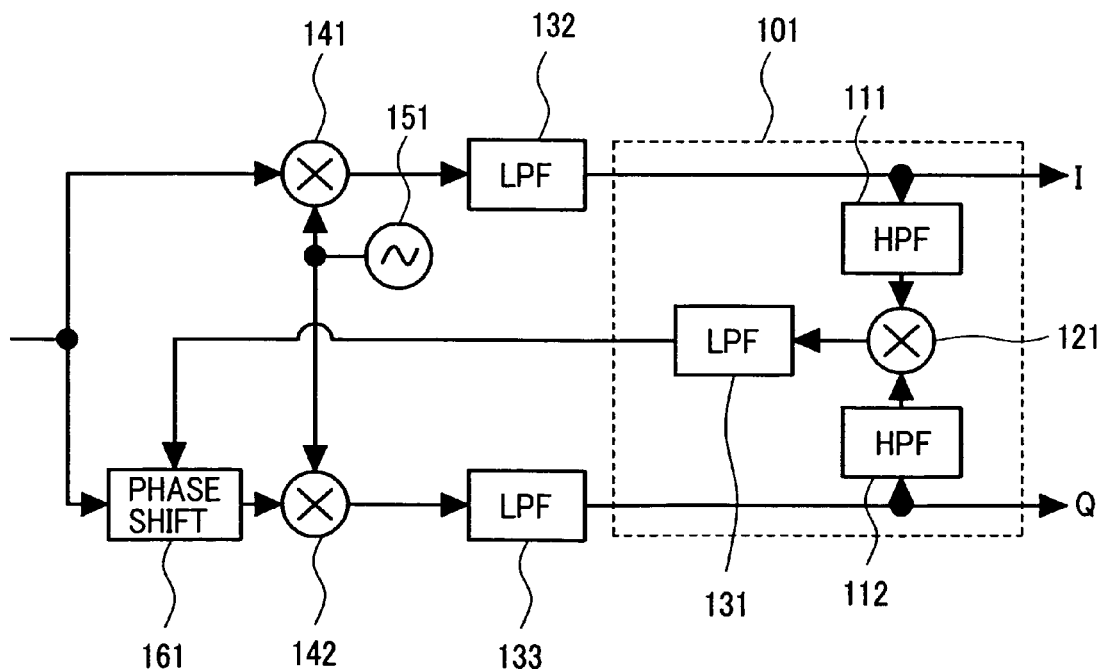
FIG. 3 shows a block diagram of another example of a quadrature demodulator having functions for compensating orthogonality using the orthogonality detector according to the present invention as a third embodiment of the present invention.

FIG. 3, illustrating a third embodiment according to the present invention, shows a block diagram of another example of a quadrature demodulator having an phase mismatch compensation circuit for compensating errors of orthogonal phase between in-phase and quadrature signals using the orthogonality detector according to the present invention. Components 101, 111, 112, 121, 131 constitute an orthogonality detector as similarly as in the first embodiment. Low pass filters 132, 133, mixers 141, 142, a local oscillator 151 and a variable phase shifter 161 constitute a quadrature demodulation circuit section. A quadrature demodulator in the present embodiment, as similarly as in the second embodiment, comprises the quadrature demodulation circuit section and the orthogonality detector into which the outputs of the quadrature demodulation circuit section is input. It further comprises a circuit for compensating phase mismatches between in-phase and quadrature components of the outputs of the quadrature demodulation circuit section based on the outputs of the orthogonality detector 101.

The orthogonality detector 101 comprises a first high pass filter 111 for removing low frequency components of in-phase components of the signals input from quadrature demodulation circuit section, a second high pass filter 112 for removing low frequency components of quadrature components of the signals input from the quadrature demodulation circuit section, a multiplier 121 for multiplying the respective outputs of the first and second high pass filters 111, 112 each other, and a low pass filter 131 for removing high frequency components from the outputs of the multiplier 121, wherein the orthogonality between the in-phase and quadrature components of the signals input from the quadrature demodulation circuit section is detected based on the outputs of the low pass filter 131. The outputs of the quadrature demodulation circuit section of which phase mismatches are compensated based on the orthogonality of the two signals detected in such a manner are considered to be the outputs of the quadrature demodulator.

The quadrature demodulation circuit section comprises the local oscillator 151, the first mixer 141 outputting in-phase components of the input signal of the quadrature demodulation circuit section, the second mixer 142 outputting quadrature components of the input signals of the quadrature demodulation circuit section, and the variable phase shifter 161 connected between the output terminal of the orthogonality detector 101 and the input terminal of either the first or second mixer 141, 142. The variable phase shifter 161 changes phase shift quantity of the variable phase shifter 161 based on the outputs of the orthogonality detector 101 and controls input phase of any of the first or second mixer 141, 142 to which the output terminal of the variable phase shifter 161 is connected.

The input terminal of the variable phase shifter 161 is connected to the input terminal of the quadrature demodulation circuit section, the output of the variable phase shifter 161 is connected to the input terminal of any of the first or second mixer 141, 142, and the input signal of the quadrature demodulation circuit section of which phase is controlled by the variable phase shifter 161 is supplied to which of the first or second mixer 141, 142 the output terminal of the variable phase shifter 161 is connected. FIG. 3 shows an example of structure of which the input terminal of the quadrature demodulation circuit section is connected to the input terminal of the first mixer 141, and the output terminal of a variable phase comparator 161 is connected to the input terminal of the mixer 142. This embodiment is not limited only to this structure. It also includes, for example a structure of which the input terminal of the quadrature demodulation section and the output terminal of the variable comparator 161 are exchanged each other, that is, the output terminal of the variable comparator 161 is connected to the input terminal of the first mixer 141, and the input terminal of the quadrature demodulation circuit section is connected to the input terminal of the second mixer 142.

The orthogonality between the in-phase and quadrature signals demodulated by quadrature demodulator and output from the low pass filters is detected by the orthogonality detector according to the present invention. Orthogonality between the in-phase and quadrature signals is compensated by controlling phase shift quantity of the variable phase shifter 161 using the detected signals and adjusting the phase of reception signals input into the mixer 142. According to the present embodiment, orthogonality can be detected quickly compared to a conventional case based on the cross correlation by using the outputs of the low pass filter 131 as index of the orthogonality, and accordingly, as similarly as in the second embodiment, a quadrature demodulator capable of quickly outputting signals consisting of the in-phase and quadrature components compensated in the phase mismatches can be realized.

Fourth Embodiment

Figure 4:
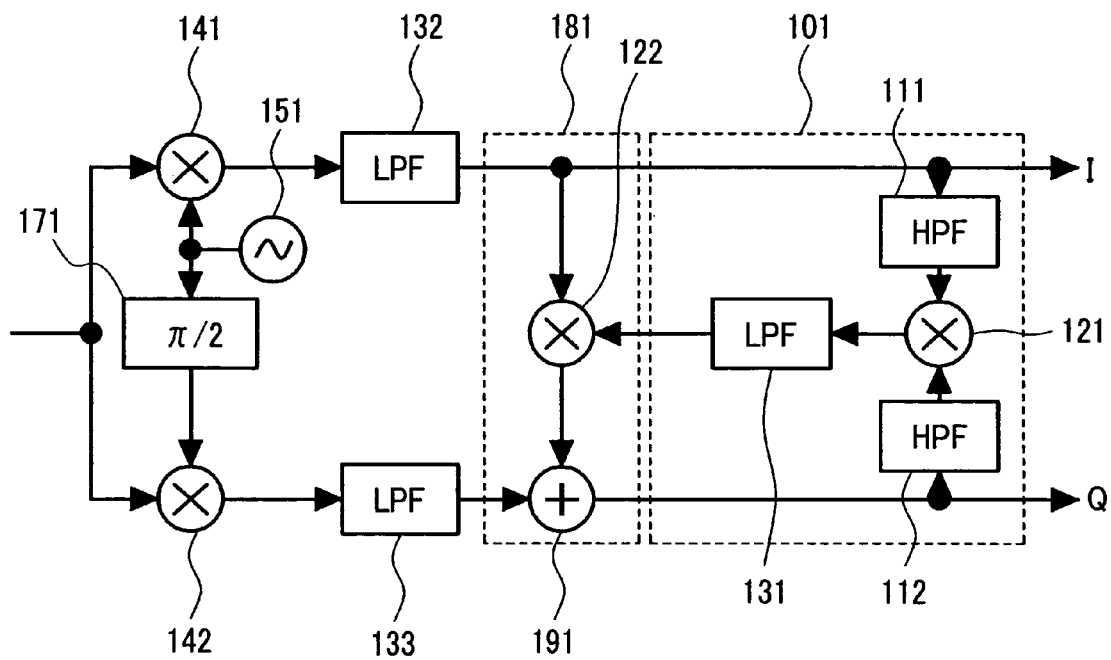
FIG. 4 shows a block diagram of a further other example of a quadrature demodulator having functions for compensating orthogonality using the orthogonality detector according to the present invention as a fourth embodiment of the present invention.

FIG. 4, illustrating a fourth embodiment according to the present invention, further shows a block diagram of another example of a quadrature demodulator having an phase mismatch compensation circuit for compensating errors of orthogonal phase between in-phase and quadrature signals using the orthogonality detector according to the present invention. Components 101, 111, 112, 121, 131 constitute an orthogonality detector as similarly as in the first embodiment. Low pass filters 132, 133, mixers 141, 142, a local oscillator 151 and a fixed phase shifter 171 constitute a quadrature demodulation circuit section. A multiplier 122 and an adder 191 constitute a phase compensator 181.

The orthogonality between the in-phase and quadrature signals demodulated by quadrature demodulator and output from the low pass filters is detected by the orthogonality detector according to the present invention. Orthogonality between in-phase and quadrature signals is compensated by controlling the phase compensator 181 using the detected signals. The following relation as shown by [Formula 1] can be provided between in-phase signal (I) and quadrature signal (Q) which can be obtained when the phase mismatches of the quadrature demodulator are at the angle of θ and in-phase signal ($I_{ideal}$) and quadrature signal ($Q_{ideal}$) which can be obtained in an ideal quadrature demodulation.

$$\begin{pmatrix} I_{ideal} \\ Q_{ideal} \end{pmatrix} = \begin{pmatrix} 1 & 0 \\ \tan\theta & \sec\theta \end{pmatrix} \begin{pmatrix} I \\ Q \end{pmatrix}$$

When the phase mismatches are small enough, the above formula would be equivalent to [Formula 2] since tan θ→θ and secθ→1.

$$\begin{pmatrix} I_{ideal} \\ Q_{ideal} \end{pmatrix} = \begin{pmatrix} 1 & 0 \\ \theta & 1 \end{pmatrix} \begin{pmatrix} I \\ Q \end{pmatrix}$$

This means that the phase mismatches between in-phase components and quadrature components are compensated by performing linear transformation on the in-phase components and quadrature components. The relation is realized as a form of circuit by the phase compensator 181 connected between the output terminal of the orthogonality detector 101 and the output terminal of the quadrature demodulation circuit section as shown in FIG. 4. As described above, phase mismatch compensation can be achieved by a feedback loop in a structure shown in FIG. 4.

The phase compensator 181 comprises the multiplier 122 of which input terminal is connected to any of the output terminal of the orthogonality detector 101 and an in-phase component output terminal (output terminal of the low pass filter 132) and quadrature component output terminal (output terminal of the low pass filter 133) of the quadrature demodulation circuit section, and the adder 191 of which input terminal is connected to the output terminal of the multiplier 122 and the other one of the in-phase component output terminal and quadrature component output terminal of the quadrature demodulation circuit section. FIG. 4 shows an example of structure of which the in-phase component output terminal (output terminal of the low pass filter 132) of the quadrature demodulation circuit section is connected to the input terminal of the multiplier 122, and the quadrature component output terminal (output terminal of the low pass filter 133) is connected to the input terminal of the adder 191. This embodiment is not limited only to this structure. It also includes, for example a structure of which the quadrature component output terminal and in-phase component output terminal of the quadrature demodulation circuit section are exchanged each other, that is, the quadrature component output terminal (output terminal of the low pass filter 133) is connected to the input terminal of the multiplier 122, and the in-phase component output terminal (output terminal of the low pass filter 132) is connected to the input terminal of the adder 191.

According to the present embodiment, orthogonality can be detected quickly compared to a conventional case based on the cross correlation by using the outputs of the low pass filter 131 as index of the orthogonality, and accordingly, as similarly as in the second and third embodiments, a quadrature demodulator capable of quickly outputting signals consisting of the in-phase and quadrature components compensated in the phase mismatches can be realized. The quadrature demodulator having the above mentioned effect can be realized without installation of a variable phase shifter.

Fifth Embodiment

Figure 5:
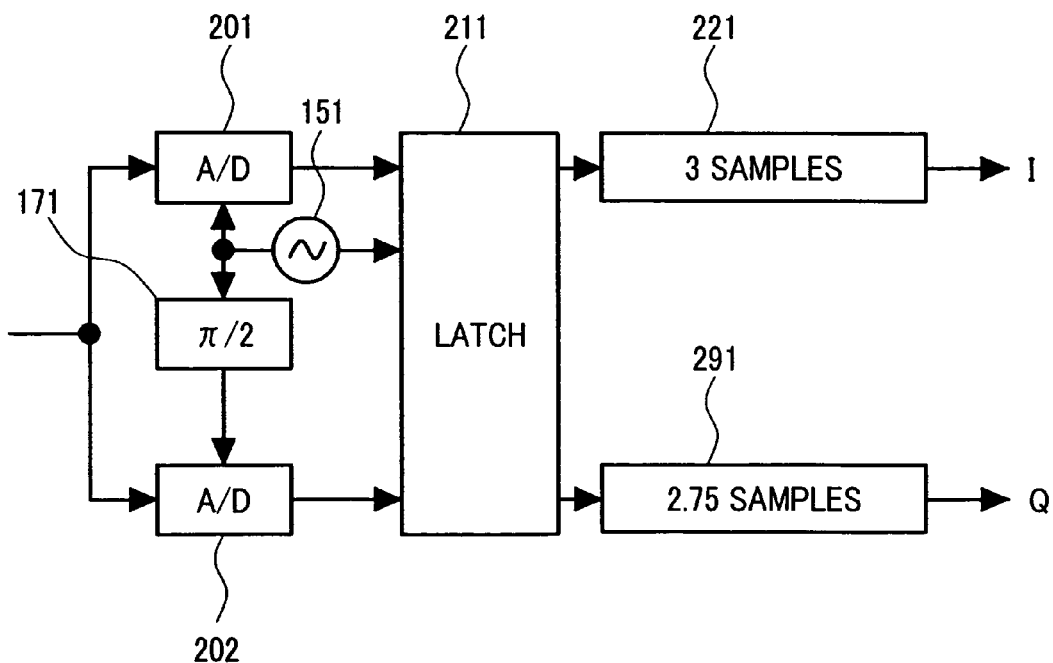
FIG. 5 shows a block diagram illustrating a quadrature demodulator in sampling quadrature demodulation manner using group delay difference compensation according to the present invention as a fifth embodiment of the present invention.
Figure 12:
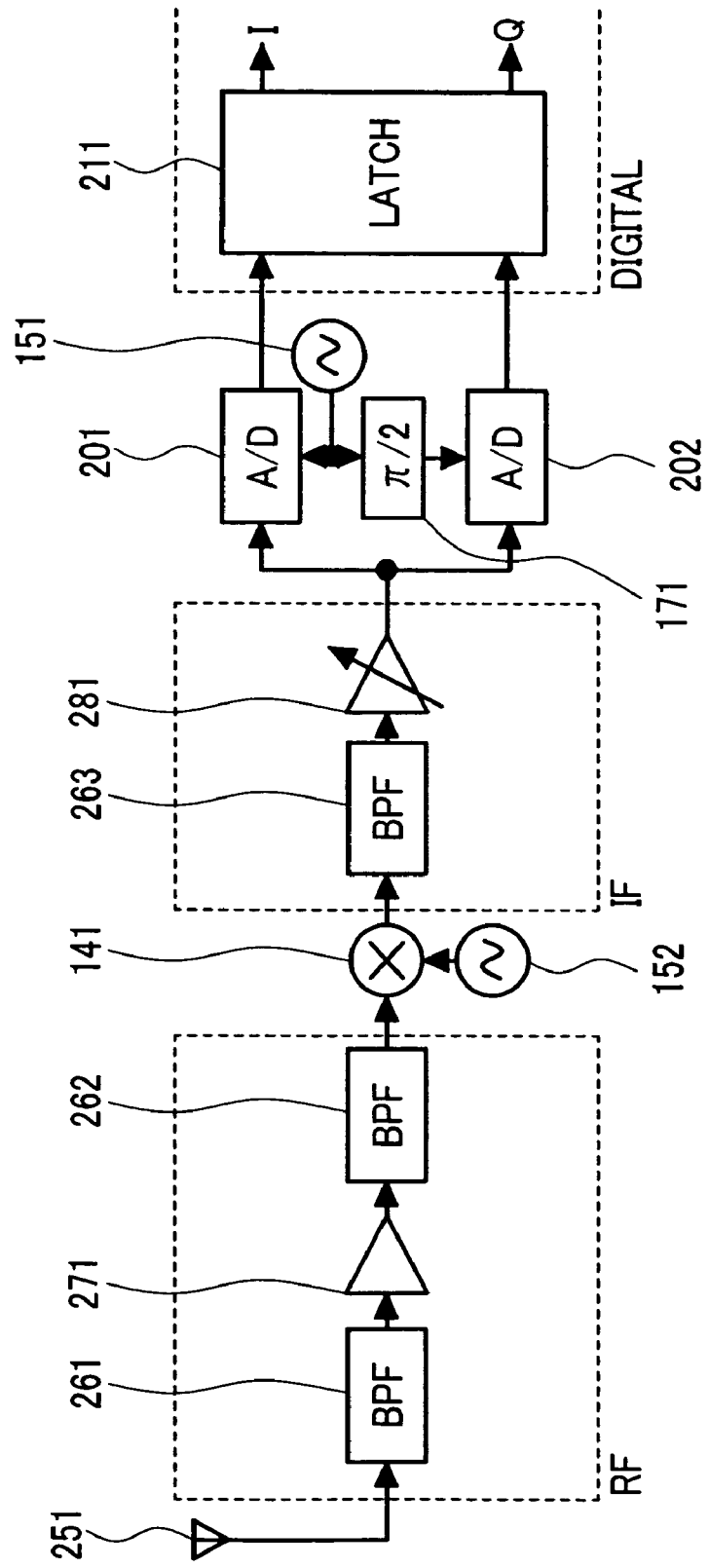
FIG. 12 shows a block diagram of a receiver structure in sampling quadrature demodulation manner.
Figure 13A:
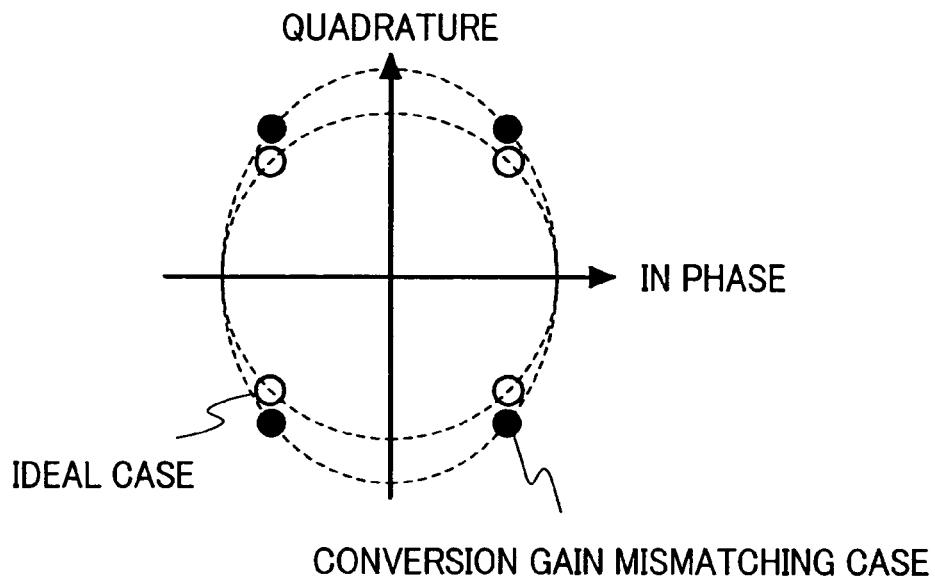
FIGS. 13A, 13B show diagrams illustrating constellation change in a case there is a conversion gain error or a phase mismatch in quadrature demodulation.
Figure 13B:
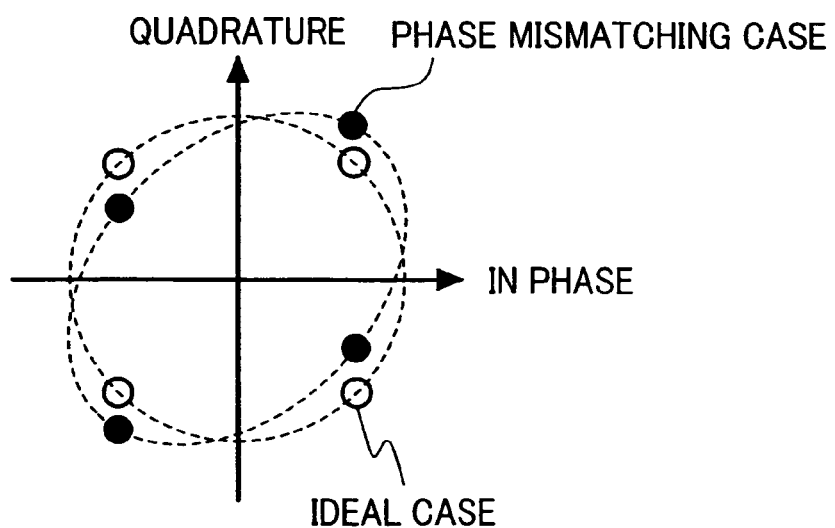

FIG. 5, illustrating a fifth embodiment according to the present invention, shows a block diagram of a quadrature demodulator in sampling quadrature demodulation manner (sampling quadrature demodulator) comprising a circuit for compensating group delay difference between in-phase and quadrature signals. Components 151, 171, 201, 202, 211 constitute a sampling quadrature demodulation circuit section as similarly as the components shown in FIG. 12. Group delay difference of, for example ¼ sample is compensated for a group delay difference compensator consisting of a fixed delay device 221 and a digital filter 291 for fixed delay to differentiate the delay between the in-phase signals and quadrature signals.

The sampling quadrature demodulator of the present embodiment comprises a sampling quadrature demodulation circuit section sampling the input signals at the frequency of 1/n of the carrier frequency of the input signals, synchronizing the timing between the in-phase and quadrature components of the sampled input signals, and outputting generally synchronized in-phase digital signals and quadrature digital signals, and the group delay difference compensator being connected to the output terminal of the sampling quadrature demodulation circuit section, differentiating the delay difference between the in-phase digital signals and quadrature digital signals, and compensating the group delay difference between demodulated in-phase components and quadrature components.

The sampling quadrature demodulation circuit section comprises a local oscillator 151, a fixed phase shifter 171 connected to the output terminal of the local oscillator 151, a first A/D converter 201 connected to the output terminal of the local oscillator 151 commonly with the fixed phase shifter 171 and to the input terminal of the sampling quadrature demodulation circuit section for outputting in-phase digital signals by sampling the input signals at 1/n of the carrier frequency of the input signals of the sampling quadrature demodulation circuit section, a second A/D converter 202 connected to the output terminal of the fixed phase shifter 171 and to the input terminal of the sampling quadrature demodulation circuit section for outputting quadrature digital signals by sampling the input signals at 1/n of the carrier frequency of the input signals, and a latch 211 connected to the output terminal of the local oscillator 151, the output terminal of the first A/D converter 201 and the output terminal of the second A/D converter 202 for synchronizing the timing between the in-phase digital signals supplied from the first A/D converter 201 and the quadrature digital signals supplied from the second A/D converter 202.

The group delay difference compensator comprises a fixed delay device 221 connected to the in-phase digital signal output terminal of the latch 211 and a digital filter 291 for fixed delay connected to the quadrature digital signal output terminal of the latch 211. The delay quantity provided to the in-phase signals and quadrature signals can be of any combinations as long as the combination having the difference of, for example ¼ sampling time. However, a digital filter having small delay time is hardly used for group delay compensation since such a filter has ripples for the delay property or amplitude property. Accordingly, as shown in FIG. 5, it would be practical that the delay time of the fixed delay device or digital filter for fixed delay is set larger than one sampling time, and the difference of delay quantity provided to the in-phase signals and quadrature signals is set, for example ¼ sampling time.

The input signals of the sampling quadrature device are converted into in-phase digital signals and quadrature digital signals at a sampling quadrature demodulation section consisting of the local oscillator 151, the fixed phase shifter 171, and the A/D converters 201, 202. Since the outputs of the first and second A/D converters 201, 202 are shifted by, for example ¼ sample in sampling timing, the timing is synchronized by the latch 211 for enabling afterward digital processing. Then the outputs of the latch 211 are processed by the digital signal processor. The group delay difference of predetermined times (for example, ¼ sampling time) between the in-phase and quadrature components of the demodulated signals is compensated by differentiating the delays of the in-phase and quadrature signals at the group delay difference compensator into which the outputs of the latch 211 are input. Using the above mentioned structure, the group delay difference between the in-phase and quadrature signals can be compensated for the sampling quadrature demodulator.

According to this embodiment, the group delay difference between the in-phase and quadrature signals can be compensated in the sampling quadrature demodulation manner. For the effect of the group delay difference in the sampling quadrature demodulation manner, EVM (Error Vector magnitude) would be 2.6% when GMSK modulated waves are received by an A/D converter operated at the frequency of 8 times of a symbol rate while in this embodiment, the EVM can be compensated.

Sixth Embodiment

Figure 6:
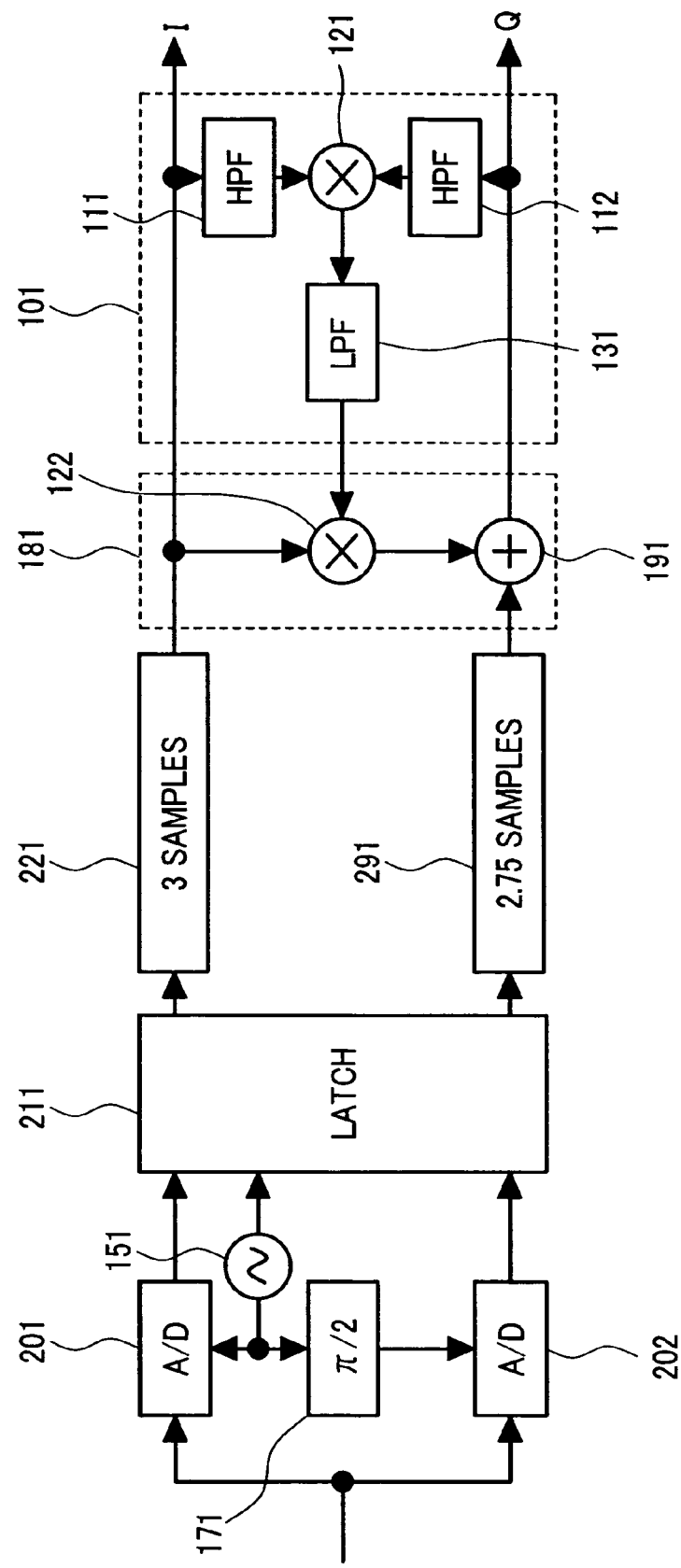
FIG. 6 shows a block diagram illustrating a quadrature demodulator in sampling quadrature demodulation manner adopting group delay difference compensation according to the present invention and phase mismatch compensation using the orthogonality detector according to the present invention as a sixth embodiment of the present invention.

FIG. 6, illustrating a sixth embodiment according to the present invention, shows a block diagram of a sampling quadrature demodulator having a circuit for compensating group delay difference and orthogonal errors between in-phase and quadrature signals generally coincidently. Components 151, 171, 201, 202, 211 221, 291 constitute a quadrature demodulator (sampling quadrature demodulator) in the sampling quadrature demodulation manner having group delay difference compensation functions as similarly as the components shown in FIG. 5. Components 101, 111, 112, 121, 131 122, 181, 191 constitute a compensator of phase mismatches comprising an orthogonality detector and a phase compensator as similarly as in the fourth embodiment.

The sampling quadrature demodulator of this embodiment comprises, in addition to the structure of the fifth embodiment, an orthogonality detector 101 detecting the orthogonality between in-phase digital signals as outputs of the fixed delay device 221 and quadrature digital signals as outputs of the digital filter 291 for fixed delay; and a phase compensator 181 connected between the output terminal of the orthogonality detector 101 and the output terminals of fixed delay device 221 and the digital filter 291 for fixed delay, and performing linear transformation on the in-phase digital signals and the quadrature digital signals. The phase mismatches between in-phase and quadrature components of the outputs of the sampling quadrature demodulator is compensated by performing linear transformation on the in-phase digital signals and the quadrature digital signals by the phase compensator 181.

The phase compensator 181 comprises the multiplier 122 of which input terminal is connected to the output terminal of the orthogonality detector 101 and to the output terminal of the fixed delay device 221, and the adder 191 of which input terminal is connected to the output terminal of the multiplier 122 and to the output terminal of the digital filter 291 for fixed delay. According to this embodiment, the group delay difference and the phase mismatches can be compensated generally coincidently as shown in FIG. 6. Since the entire compensation is digitally processed, it can be aggregated inside one DPS (Digital Signal Processor). In addition, differently from analog processing, it would be easy to independently set respective circuit constants.

Seventh Embodiment

Figure 7:
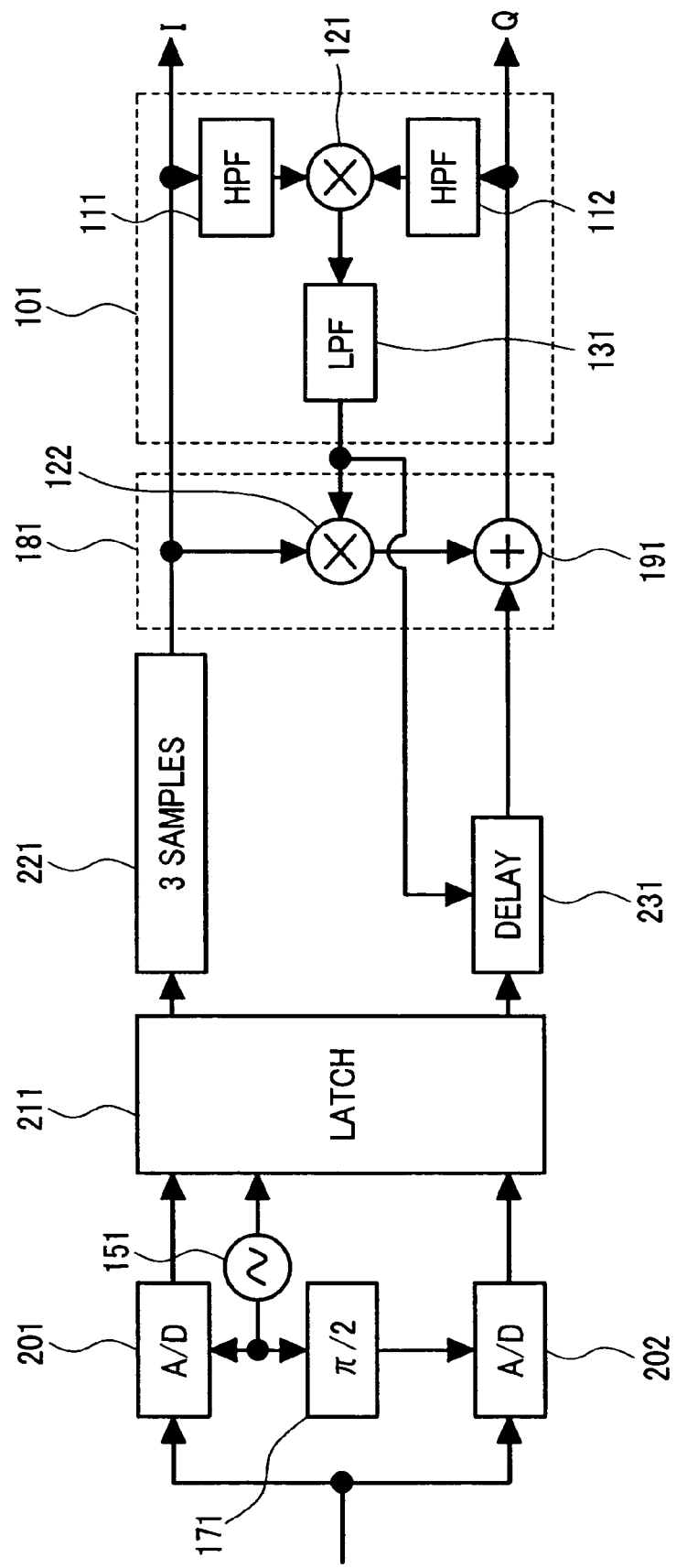
FIG. 7 shows a block diagram illustrating a quadrature demodulator in sampling quadrature demodulation manner adopting variable group delay difference compensation according to the present invention and phase mismatch compensation using the orthogonality detector according to the present invention as a seventh embodiment of the present invention.

FIG. 7, illustrating a seventh embodiment according to the present invention, shows a block diagram of a sampling quadrature demodulator having a circuit for compensating group delay difference and orthogonal errors between in-phase and quadrature signals generally coincidently in the sampling quadrature demodulation manner. In this embodiment, the group delay difference depending on the phase mismatches would be also compensated. The only different point from FIG. 6 is that the digital filter 291 for fixed delay as shown in FIG. 6 is replaced to a variable delay device 231 as shown in FIG. 7 and the delay quantity is controlled according to the outputs of the orthogonality detector 101.

The variable delay device can be structured as described below. First, the delay is provided by the digital filter, and the correspondence between the phase mismatches and the tap coefficients of the digital filter are previously designed. Such operations are performed over the range of the phase mismatch compensation, and a correspondence table is prepared and stored in a memory. In actual operation, desired group delay property can be obtained by retrieving the correspondence table from the input phase mismatches, reading out the tap coefficients, and setting the tap coefficients to the digital filter.

Eighth Embodiment

Figure 8:
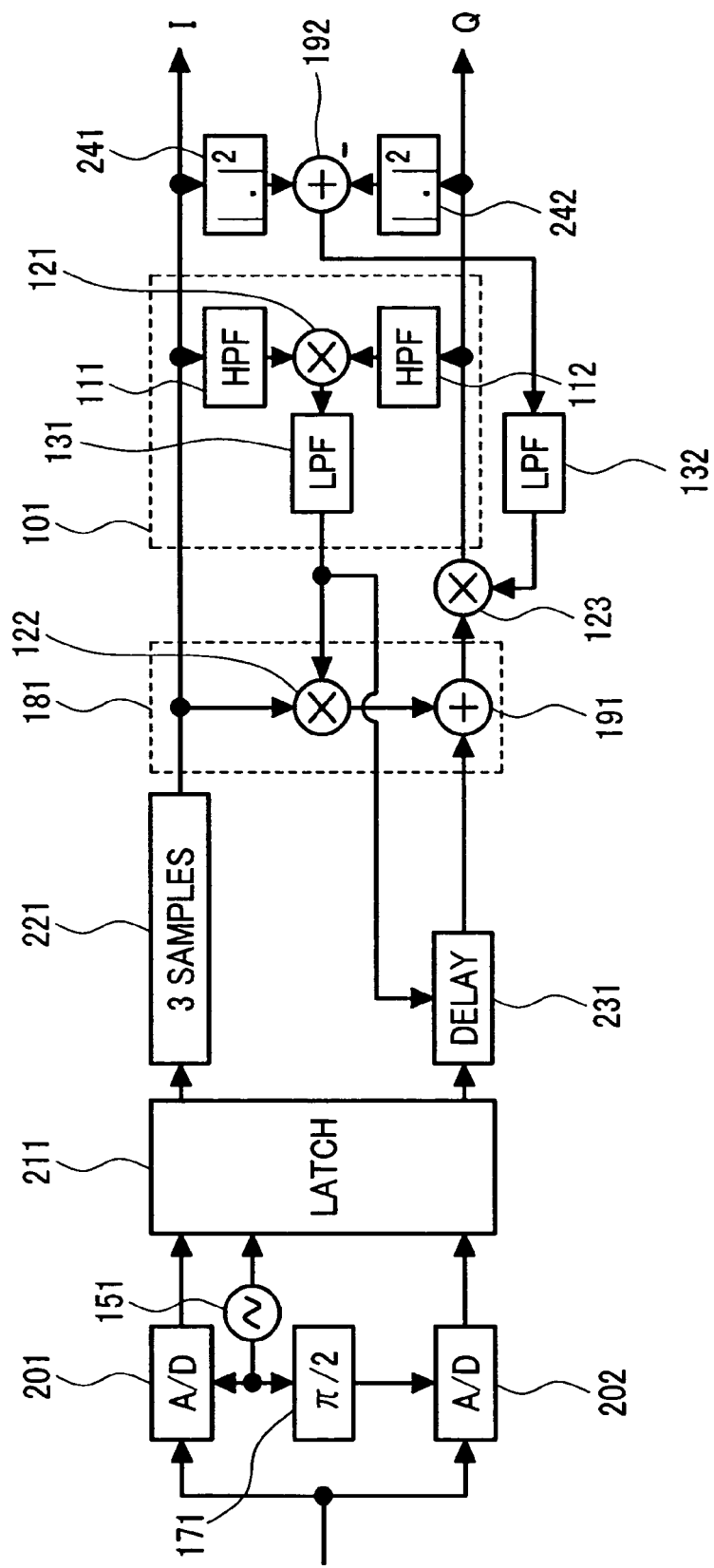
FIG. 8 shows a block diagram illustrating a quadrature demodulator in sampling quadrature demodulation manner adopting group delay difference compensation according to the present invention, phase mismatch compensation using the orthogonality detector according to the present invention, and compensation of conversion gain error as an eight embodiment of the present invention.

FIG. 8, illustrating an eighth embodiment according to the present invention, shows a block diagram of a sampling quadrature demodulator having a circuit for compensating group delay difference, phase mismatches between in-phase and quadrature signals, and conversion gain errors generally coincidently in the sampling quadrature demodulation manner. In FIG. 8, a multiplier 123, a low pass filter 132, an adder 192 and amplitude square computing units 241, 242 are added to the components as shown in FIG. 7.

The difference of conversion gain between in-phase and quadrature signals is detected by calculating the difference of outputs of the amplitude square computing units 241, 242 at the adder 123. Since outputs of the adder 123 include variation due to signal modulation, the variation is removed by the low pass filter 132 and the quadrature components are amplified based on the result. Thus, compensation is performed so as to make identical the conversion gain of the in-phase signals and that of the quadrature signals.

Figure 10:
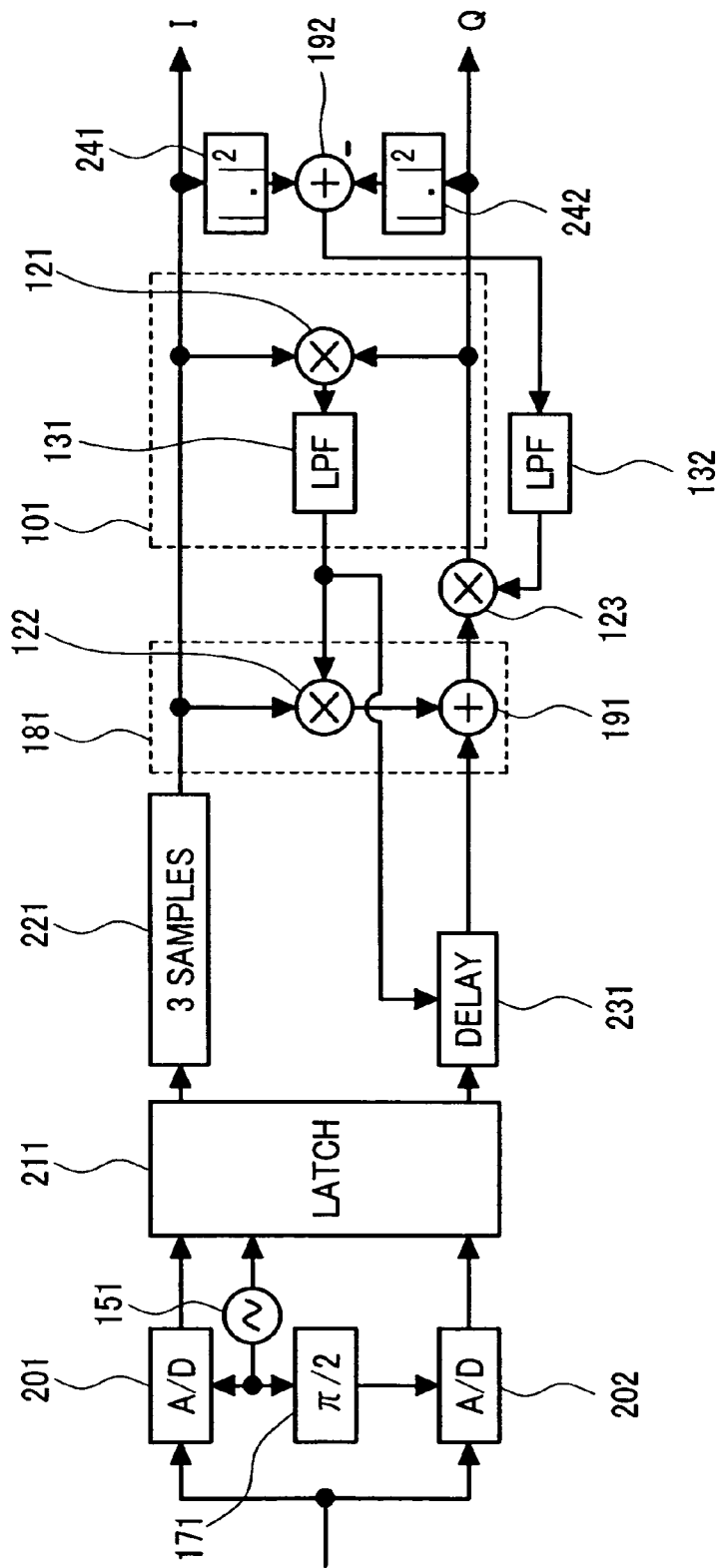
FIG. 10 shows a block diagram in a case that the orthogonality detector as in FIG. 8 is replaced to a conventional orthogonality detector.
Figure 11:
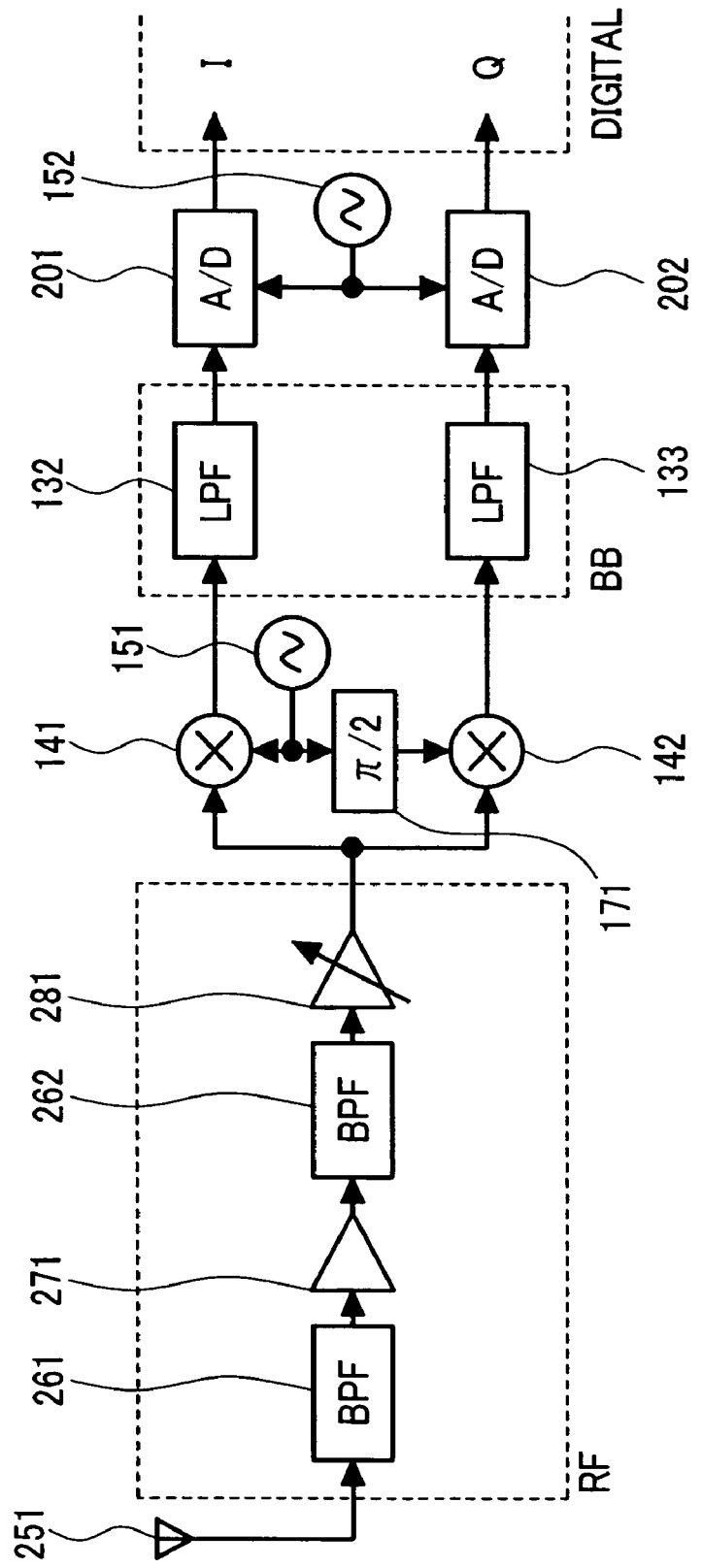
FIG. 11 shows a block diagram of a receiver structure in direct conversion manner.
Figure 14:
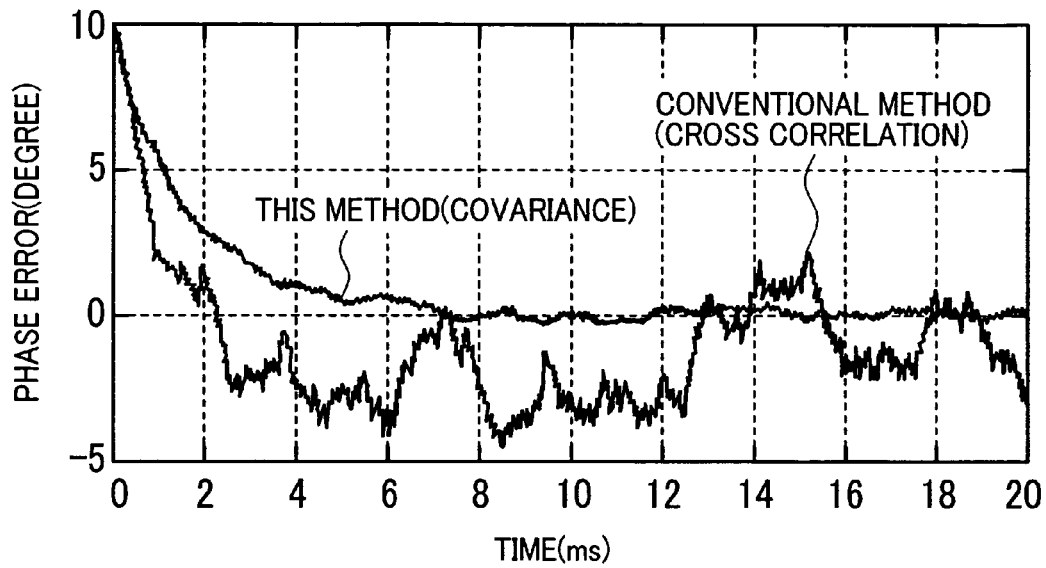
FIG. 14 shows a diagram illustrating convergence of phase error when the phase mismatches are compensated in respective structures as in FIGS. 8 and 10.

For checking convergence of compensation of the phase mismatches, a simulation was performed using GMSK modulated waves with carrier frequency of eight times of operation frequencies of the A/D converters 201, 202. For comparison with a conventional orthogonality detector, a simulation was also performed in the block diagram in FIG. 10. FIG. 10 is the same as FIG. 8 except for absence of wide band pass filters 111, 112. That is, in FIG. 10, a conventional manner based on cross correlation is adopted for detecting orthogonality. The result of providing the angle of 10 degrees as an initial value for the phase errors is shown in FIG. 14. In the conventional manner based on cross correlation, RMS (Root-Mean-Square) phase error after convergence is 3.4 degrees while in the manner according to the present invention based on covariance, RMS phase error after convergence is as low as 0.3 degree, and thus the effect of the present invention can be confirmed.

Figure 15:
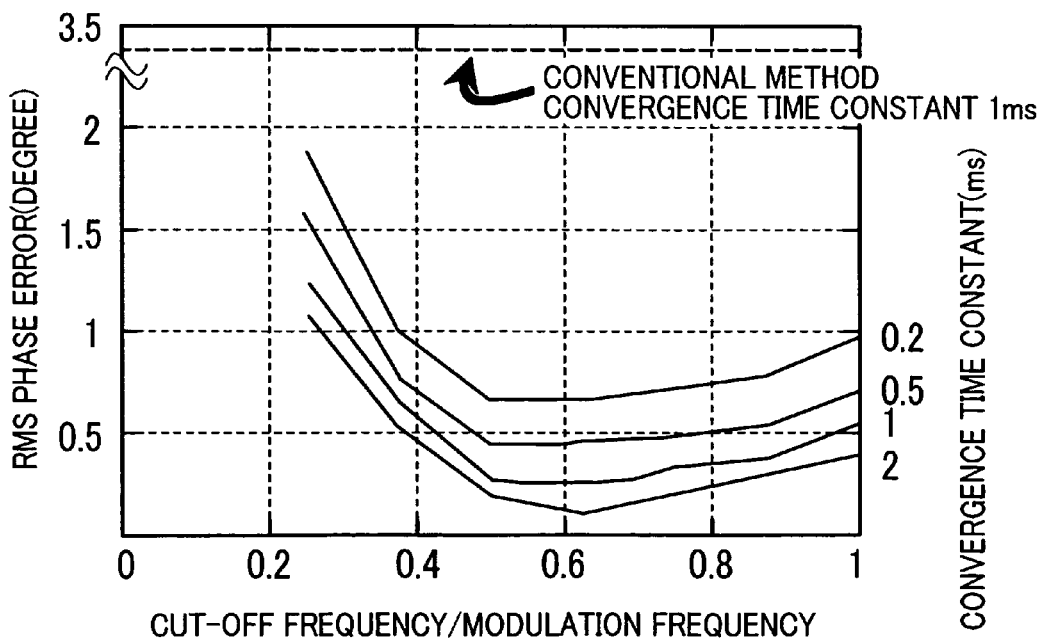
FIG. 15 shows a diagram illustrating relation between cutoff frequency of a high pass filter at the time of phase mismatch compensation and RMS phase error after convergence.

In FIG. 15, the relation between RMS phase errors by cutoff frequencies of high pass filters 111, 112 is provided in the same condition. The horizontal axis is cutoff frequency normalized with the modulation frequency, and the longitudinal axis is RMS phase errors after convergence. The loop gain of a feedback loop is changed, and the difference of time constant relating to the convergence was also considered. A linear IIR (Infinite Impulse Response) filter was used for the high pass filter. For reference, RMS phase errors compensated in the conventional manner are also shown.

Figure 16:
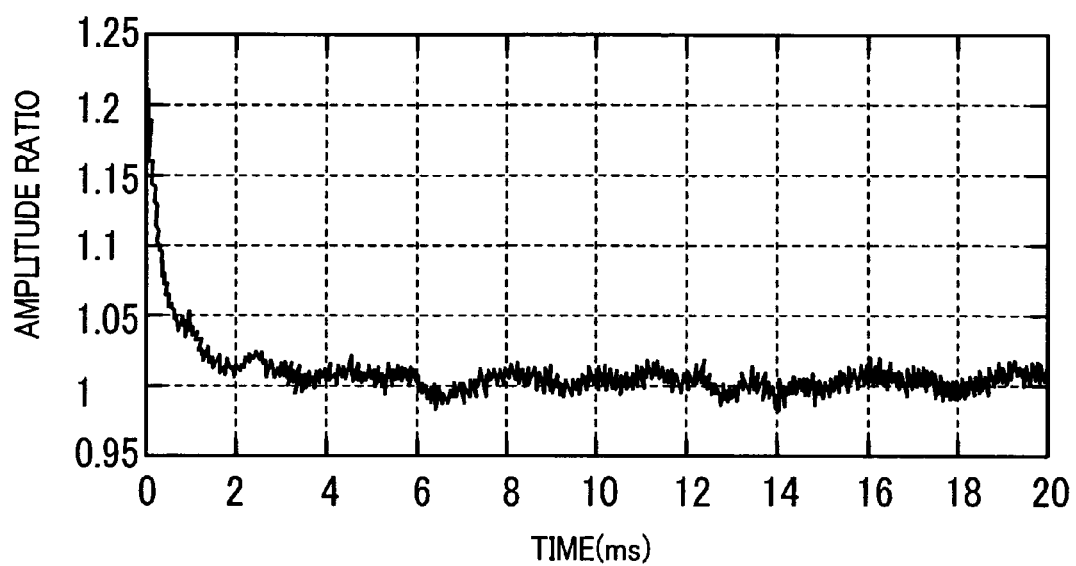
FIG. 16 shows a diagram illustrating convergence of ratio of in-phase signals and quadrature signals when the conversion gain is compensated in the structure as in FIG. 8.

For GMSK modulated waves, it has been determined that the cutoff frequency of the high pas filter should be optimally set to be 0.5-0.6 time of the modulated waves. The result might be different depending on the used modulation manner. In a receiver receiving signals with many kinds of modification manner, the cutoff frequency of the high pass filter should be changed according to the modulation manner for the received signals. As shown in FIG. 8, constituting the orthogonality detector according to the present invention enables a flexible change in the cutoff frequency. FIG. 16 shows a diagram illustrating the convergence of error compensation of conversion gain. As initial value for conversion gain difference, an amplitude ratio between in-phase and quadrature signals was provided. It can be confirmed that the errors after convergence is restrained within +/−1%.

What is claimed is:

1. A quadrature demodulator, comprising:
   a quadrature demodulation circuit section; and
   an orthogonality detector into which outputs of the quadrature demodulation circuit section are input,
   wherein the quadrature demodulation circuit further comprises a circuit for compensating phase mismatch between in-phase components and quadrature components from outputs of the quadrature demodulation circuit section based on outputs of the orthogonality detector,
   wherein the orthogonality detector further comprises
      a first high pass filter for removing low frequency components of in-phase components of the signal input I from the quadrature demodulation circuit section,
      a second high pass filter for removing low frequency components of quadrature components of the signal input Q from the quadrature demodulation circuit section,
      a multiplier for multiplying outputs of the first and second high pass filters with each other, and
      a low pass filter for removing high frequency components from an output of the multiplier,
      wherein the orthogonality detector is configured to detect an orthogonality error between the in-phase and quadrature components of the signals input from the quadrature demodulation circuit section based on the output of the low pass filter, and to compensate the output of the quadrature demodulation circuit section based on the orthogonality error, to provide a compensated output of the quadrature demodulator,
      wherein an output from the first high pass filter is (I−E[I]), an output from the second high pass filter is (Q−E[Q]), E being an average, and
   wherein the output from the multiplier comprises a covariance E[(I−E[I]) (Q−E[Q])],
   wherein the quadrature demodulation circuit section comprises
      a local oscillator,
      a first mixer outputting in-phase components of the input signal of the quadrature demodulation circuit section,
      a second mixer outputting quadrature components of the input signal of the quadrature demodulation circuit section, and
      a variable phase shifter connected between an output terminal of the orthogonality detector and an input terminal of one of the first and second mixers,
      wherein the variable phase shifter changes a phase shift quantity based on the output of the orthogonality detector, and controls an input phase of the mixer to which the output terminal of the variable phase shifter is connected.

2. The quadrature demodulator according to claim 1, wherein an input terminal of the variable phase shifter is connected to the output terminal of the local oscillator commonly with one of the first and second mixers, an output of the local oscillator is connected to the other of the first and second mixers, and the output of the local oscillator of which phase is controlled by the variable phase shifter is supplied to the one of the first and second mixers to which the output terminal of the variable phase shifter is connected.

3. The quadrature demodulator according to claim 1, wherein an input terminal of the variable phase shifter is connected to the output terminal of the quadrature demodulation circuit section, the output of the local oscillator is connected to the input terminal of one of the first and second mixers, and the input of the quadrature demodulation circuit section of which phase is controlled by the variable phase shifter is supplied to the one of the first and second mixers to which the output terminal of the variable phase shifter is connected.

4. A quadrature demodulator, comprising:
   a quadrature demodulation circuit section; and
   an orthogonality detector into which outputs of the quadrature demodulation circuit section are input,
   wherein the quadrature demodulation circuit further comprises a circuit for compensating phase mismatch between in-phase components and quadrature components from outputs of the quadrature demodulation circuit section based on outputs of the orthogonality detector,
   wherein the orthogonality detector further comprises
      a first high pass filter for removing low frequency components of in-phase components of the signal input I from the quadrature demodulation circuit section,
      a second high pass filter for removing low frequency components of quadrature components of the signal input Q from the quadrature demodulation circuit section,
      a multiplier for multiplying outputs of the first and second high pass filters with each other, and
      a low pass filter for removing high frequency components from an output of the multiplier,
      wherein the orthogonality detector is configured to detect an orthogonality error between the in-phase and quadrature components of the signals input from the quadrature demodulation circuit section based on the output of the low pass filter, and to compensate the output of the quadrature demodulation circuit section based on the orthogonality error, to provide a compensated output of the quadrature demodulator, wherein an output from the first high pass filter is (I−E[I]), an output from the second high pass filter is (Q−E[Q]), E being an average, and wherein the output from the multiplier comprises a covariance E[(I−E[I]) (Q−E[Q])], wherein the orthogonality error between in-phase components and quadrature components of the output of the quadrature demodulation circuit section is compensated by performing linear transformation on the in-phase components and quadrature components of the signal input from the quadrature demodulation circuit section.

5. The quadrature demodulator according to claim 4, wherein the linear transformation is performed by a phase compensator connected between an output terminal of the orthogonality detector and output terminals of the quadrature demodulation circuit section.

6. The quadrature demodulator according to claim 5, wherein the phase compensator comprises:

a multiplier having an input terminal connected to the output terminal of the orthogonality detector and to one of an in-phase component output terminal and a quadrature component output terminal of the quadrature demodulation circuit section; and an adder having an input terminal connected to an output terminal of the multiplier and to the other one of the in-phase component output terminal and the quadrature component output terminal of the quadrature demodulation circuit section.

* * * * *